(12) United States Patent
Burberry et al.

(10) Patent No.: US 6,610,455 B1
(45) Date of Patent: Aug. 26, 2003

(54) MAKING ELECTROLUMINSCENT DISPLAY DEVICES

(75) Inventors: Mitchell S. Burberry, Webster, NY (US); Lee W. Tutt, Webster, NY (US); Myron W. Culver, Rochester, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/060,670

(22) Filed: Jan. 30, 2002

(51) Int. Cl.[7] .................................................. H01J 9/227
(52) U.S. Cl. ..................... 430/200; 430/201; 430/321
(58) Field of Search ................................. 430/321, 200, 430/201

(56) References Cited

U.S. PATENT DOCUMENTS

| | | |
|---|---|---|
| 3,180,730 A | 4/1965 | Klupfel et al. |
| 3,567,450 A | 3/1971 | Brantyly et al. |
| 3,658,520 A | 4/1972 | Brantyly et al. |
| 4,720,432 A | 1/1988 | VanSlyke et al. |
| 4,769,292 A | 9/1988 | Tang et al. |
| 4,772,582 A | 9/1988 | DeBoer |
| 5,061,569 A | 10/1991 | VanSlyke et al. |
| 5,141,671 A | 8/1992 | Bryan et al. |
| 5,150,006 A | 9/1992 | Van Slyke et al. |
| 5,151,629 A | 9/1992 | VanSlyke |
| 5,405,709 A | 4/1995 | Littman et al. |
| 5,484,922 A | 1/1996 | Moore et al. |
| 5,578,416 A | 11/1996 | Tutt |
| 5,593,788 A | 1/1997 | Shi et al. |
| 5,645,948 A | 7/1997 | Shi et al. |
| 5,683,823 A | 11/1997 | Shi et al. |
| 5,688,551 A | 11/1997 | Littman et al. |
| 5,742,129 A | 4/1998 | Nagayama et al. |
| 5,755,999 A | 5/1998 | Shi et al. |
| 5,851,709 A | 12/1998 | Grande et al. |
| 5,928,802 A | 7/1999 | Shi et al. |
| 5,935,720 A | 8/1999 | Chen et al. |
| 5,935,721 A | 8/1999 | Shi et al. |
| 6,020,078 A | 2/2000 | Chen et al. |
| 6,114,088 A | 9/2000 | Wolk et al. |
| 6,140,009 A | 10/2000 | Wolk et al. |
| 6,208,075 B1 | 3/2001 | Hung et al. |
| 6,214,520 B1 | 4/2001 | Wolk et al. |
| 6,221,553 B1 | 4/2001 | Wolk et al. |

FOREIGN PATENT DOCUMENTS

| | | | |
|---|---|---|---|
| EP | 0 851 714 A2 | * | 7/1998 |
| EP | 0891121 | | 1/1999 |
| EP | 1009041 | | 6/2000 |
| EP | 1029909 | | 8/2000 |
| JP | 62-128766 A | * | 6/1987 |
| WO | WO 98/55561 | | 12/1998 |
| WO | WO 00/14777 | * | 3/2000 |
| WO | WO 00/18857 | | 4/2000 |
| WO | WO 00/57676 | | 9/2000 |
| WO | WO 00/70655 | | 11/2000 |

* cited by examiner

Primary Examiner—John A. McPherson
(74) Attorney, Agent, or Firm—Raymond L. Owens

(57) ABSTRACT

A method for making an organic electroluminescent display device having an array of pixels disposed on a display substrate includes providing a donor element and a display substrate that are heated to a desired temperature. Radiation-induced thermal transfer is then used to transfer organic material from the donor element to the display substrate.

16 Claims, 2 Drawing Sheets

MAKING ELECTROLUMINSCENT DISPLAY DEVICES

CROSS REFERENCE TO RELATED APPLICATIONS

Reference is made to commonly assigned U.S. patent application Ser. Nos. 09/625,423, filed Jul. 25, 2000 by Lee W. Tutt et al. and 10/060,837, filed concurrently herewith entitled "Using Spacer Elements to Make Electroluminescent Display Devices" by Mitchell S. Burberry et al.; the disclosures of which are incorporated herein by reference.

FIELD OF THE INVENTION

The present invention relates to a method of making organic electroluminescent devices and, more particularly, to using radiation-induced thermal transfer of organic materials to produce display elements.

BACKGROUND OF THE INVENTION

In color or full-color organic electroluminescent (EL) displays having an array of colored pixels such as red, green, and blue color pixels (commonly referred to as RGB pixels), precision patterning of the color producing organic EL media is required to produce the RGB pixels. The basic organic EL device has in common an anode, a cathode, and an organic EL medium sandwiched between the anode and the cathode. The organic EL medium may consist of one or more layers of organic thin films, where one of the layers or regions within a layer is primarily responsible for light generation or electroluminescence. This particular layer is generally referred to as the light-emitting layer of the organic EL medium. Other organic layers that may be present in the organic EL medium commonly facilitate electronic transportation, such as a hole-transporting layer (for hole conduction) or an electron-transporting layer (for electron conduction). In forming the RGB pixels in a full-color organic EL display panel, it is necessary to devise a method to precisely pattern the light-emitting layer of the organic EL medium or the entire organic EL medium. There is also a desire to increase efficiency and stability to as high as possible.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged with time. Plugged holes on the mask lead to the undesirable result of nonfunctioning pixels on the EL display.

There are further problems with the shadow mask method, which become especially apparent when making EL devices with dimensions of more than a few inches on a side it is extremely difficult to manufacture larger shadow masks with the required precision (hole position of ±5 micrometers) for accurately forming EL devices.

A method for patterning high resolution organic EL displays has been disclosed in U.S. Pat. No. 5,851,709 by Grande et al. This method is comprised of the following sequences of steps: 1) providing a donor substrate having opposing first and second surfaces; 2) forming a light-transmissive, heat-insulating layer over the first surface of the donor substrate; 3) forming a light-absorbing layer over the heat-insulating layer; 4) providing the donor substrate with an array of openings extending from the second surface to the heat-insulating layer; 5) providing a transferable, color forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. Such a method is disclosed by Littman in U.S. Pat. No. 5,688,551, and in a series of patents by Wolk et al. (U.S. Pat. Nos. 6,114,088; 6,140,009; 6,214,520; and 6,221,553). However, it has been found that the properties of the organic display materials transferred by a laser can be inferior to those deposited by conventional vapor deposition methods. Such properties include uniformity, efficiency, and stability. Thus, in order to take full advantage of the patterning advantages offered by radiation-induced thermal transfer, a need remains to improve the properties of the transferred material.

SUMMARY OF THE INVENTION

It is an object of the present invention to provide a method for patterning the organic EL medium without the limitations imposed by the conventional photolithographic or shadow mask methods.

It is another object of the present invention to provide an improved method for patterning high resolution, full color, organic EL displays.

It is another object of the invention to provide a method for patterning high resolution color EL displays without the limitation of mechanical precision alignment and allowing for dynamic alignment and simple pattern changes.

It is also an object of this invention to increase the efficiency and lifetime of the organic EL displays.

These objects are achieved by a method for making an organic electroluminescent display device having an array of pixels disposed on a display substrate, comprising the steps of:

a) providing an array of first electrodes on a display substrate;

b) providing a donor element comprising a donor support, a radiation-absorbing layer over the donor support, and at least one organic layer over the radiation-absorbing layer, wherein said organic layer comprises the material or materials to be transferred to the display substrate;

c) positioning the donor element in transfer relationship to the display substrate patterned with an array of first electrodes;

d) heating the display substrate or donor element or both within a specified temperature range prior to transfer of the organic layer;

e) focusing and scanning a laser beam of sufficient power and desired spot size on the radiation-absorbing layer of the donor element to effect the transfer of selected portions of the organic layer from the donor element to designated areas corresponding to pixels on the display substrate in electrical connection with the first electrodes; and f) providing a second electrode over the transferred organic portions on the display substrate.

ADVANTAGES

The present invention provides an advantage in that the heating step prior to radiation-induced thermal transfer yields an organic EL display with higher efficiency and higher stability. This invention is particularly suitable for making full color, organic EL displays with high quality, good efficiency, and stability. By printing with a scanning laser beam, fine precision patterning of colored pixels can be achieved, enabling the production of high resolution displays.

DETAILED DESCRIPTION OF THE INVENTION

Figure 1:
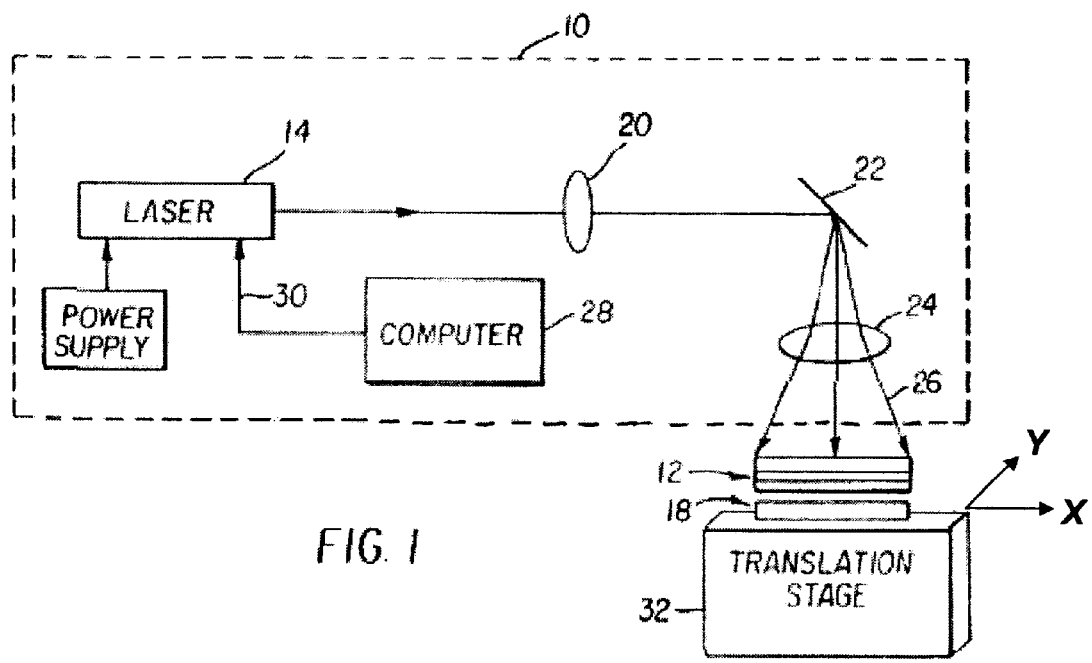
FIG. 1 shows a schematic drawing of an apparatus that is useful for transferring portions of an organic layer onto a display substrate from a donor element.

Turning now to FIG. 1, there is shown a laser printing apparatus 10 for transferring material from a donor transfer element, which will hereinafter be referred to as a donor element 12, onto a display substrate 18 in accordance with the present invention. The laser 14 of the printing apparatus 10 can be a diode laser or any other high power laser that produces a laser beam 26. More than one laser or laser beam can be used simultaneously in this invention. In order to scan the laser beam to provide relative movement between laser beam 26 and donor element 12, a galvanometer 22 that includes a moveable mirror scans the beam through an f-theta lens 24 to form a line in direction X. Those skilled in the art will understand that scanning the laser beam can also be accomplished by other kinds of moveable mirrors, such as rotating polygons with mirror faces, or by other devices such as rotating diffraction gratings.

In the embodiment shown in FIG. 1, donor element 12 and display substrate 18 are transported in a direction Y, which is orthogonal to the line, by a translation stage 32 allowing the full area to be scanned. The intensity of the beam at any point in the scan is controlled by the laser power control line 30 using instructions from the computer 28. Alternatively, the intensity of the laser beam can be controlled by a separate modulator such as an acoustooptic modulator (not shown), as is well known by those skilled in the art of laser optics. In an alternative embodiment, the substrate can remain stationary and the laser apparatus is made to move or its beam redirected optically. The important feature is that there is relative movement between the laser beam and the display substrate in order to allow full area scanning.

Figure 2:
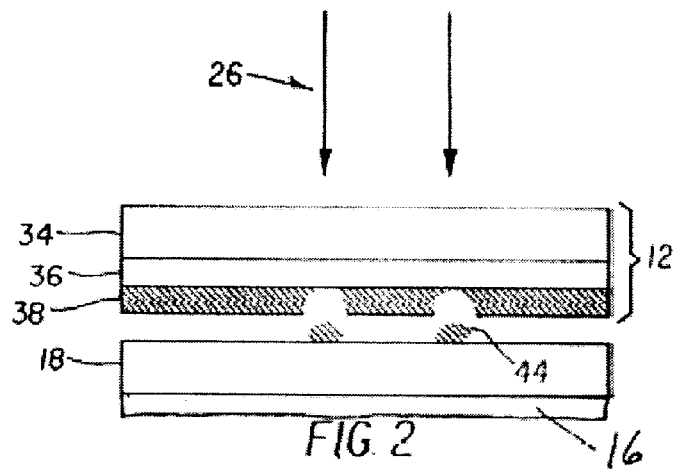
FIG. 2 is a cross sectional view which depicts, in more detail, the display substrate and the donor element with a heating element.

As shown in FIG. 2, the donor element 12 is positioned in transfer relationship to display substrate 18. Structure, materials, and fabrication of donor element 12 and display substrate 18 are discussed in more detail below, The donor element 12 and display substrate 18 may be held in this position by clamping, application of pressure, adhesives, or the like. One example of a fixture for this positioning is disclosed in commonly assigned U.S. Ser. No. 10/021,410, filed Dec. 12, 2001 entitled "Apparatus for Permitting Transfer of Organic Material From a Donor to Form a Layer in an OLED Device" by Bradley Phillips et al., the disclosure of which is hereby incorporated by reference. It is preferred that transfer takes place under an inert atmosphere, such as nitrogen or argon, or vacuum. In a preferred embodiment, there is a gap maintained between the donor element and the portions of the display substrate to which material transfer is desired. Such gaps are described in co-pending U.S. patent application Ser. No. 10/060,837, filed concurrently herewith entitled "Using Spacer Elements to Make Electroluminescent Display Devices" by Mitchell S. Burberry et al.; the disclosure of which is incorporated herein by reference.

The f-theta lens 24 focuses the laser beam onto radiation-absorbing layer 36 of donor element 12 while the galvanometer 22 scans the laser beam. The laser beam must have sufficient power to heat radiation-absorbing layer 36 to a temperature high enough to cause the material in organic layer 38 to transfer to display substrate 18 thereby forming transferred organic layer 44. In one embodiment, this occurs by partial or full vaporization of the material in organic layer 38 with condensation onto the display substrate 18. The spot size caused by the f-theta lens 24 dictates the area of the organic layer that will be transferred. The arrangement is such that, when the laser beam has sufficient power for a given rate of scan, the spot size causes material from the illuminated portion of the light emissive layer to be selectively transferred from the donor element to designated areas corresponding to pixels on the display substrate. In FIG. 2, the laser beam is shown as two spaced arrows. For convenience of illustration, it will be understood that the laser beam 26 has actually been moved between two different positions where it is turned on for transferring portions of the organic layer 38.

In a preferred embodiment, the beam is continuously scanned by the galvanometer 22 across the donor element 12 while the laser power is modulated by instructions from the computer 28. The modulation of laser power incident on the donor element 12 causes transfer of the organic material in organic layer 38 in selectable amounts in selected regions of the scan to the display substrate 18. In a preferred embodiment, most or all of the material in organic layer 38 is transferred to substrate 18.

The laser 14 can be an infrared solid-state laser, a neodynium YAG laser or any other laser providing a sufficient power to effect transfer of the organic layer. The power necessary will be dependent on the match between the absorption of the light-absorbing layer and the wavelength of the laser. The beam shape may be oval to allow small lines to be written while using low cost multimode laser, as taught in commonly assigned U.S. Ser. No. 09/128,077, filed Aug. 3, 1998 to David Kessler et al., the disclosure of which is hereby incorporated by reference.

To create a multicolor or full color display, the process is repeated for separate pixel areas using a different donor element 12 with a different organic layer 38 that will produce light of a different color when the organic EL device is fully fabricated.

In the preferred embodiment, donor element 12 used in the transfer process comprises a donor support 34 that is transmissive to the laser light, a radiation-absorbing layer 36 that converts the laser light into heat, and an organic layer 38 to be transferred. In separate embodiments, the organic layer 38 can also act as a radiation-absorbing layer and layer 36 can be eliminated. Alternatively, the support 34 can also serve as the radiation-absorbing layer, and separate layer 36 can be eliminated. Examples of donor support and radiation-absorbing materials that can be used in this invention can be found in U.S. Pat. No. 4,772,582. The donor support must be capable of maintaining the structural integrity during the light-to-heat-induced transfer. Additionally, the donor support must be capable of receiving on one surface a relatively thin coating of organic donor material, and of retaining this coating without degradation during anticipated storage periods of the coated support. Support materials meeting these requirements include, for example, glass, metal foils, plastic (polymeric) foils which exhibit a glass transition temperature value higher than a support temperature value anticipated during transfer, and fiber-reinforced plastic foils. Plastic foils are preferred. While selection of suitable support materials can rely on known engineering approaches, it will be appreciated that certain aspects of a selected support material merit further consideration when configured as a donor support useful in the practice of the invention. For example, the support can require a multistep cleaning and surface preparation process prior to precoating with transferable organic material.

The material used in the radiation-absorbing layer 36 may be a dye such as the dyes specified in U.S. Pat. No. 5,578,416 or a pigment such as carbon black. The radiation-absorbing layer may be a metal such as chromium, nickel or titanium, or a layered stack of materials that absorbs radiation by virtue of antireflection properties. The main criteria is that the light-absorbing layer absorbs at the wavelength of the laser emission with an optical density high enough to absorb most of the laser light, thereby producing sufficient heat to cause the organic layer to transfer. This transfer is well known to depend on the laser fluence, spot size, beam overlap and other factors. Generally, the optical density of the light-absorbing layer should be at least 0.1 (~20% of the light is absorbed).

An important feature of the present invention is the incorporation of a heating element 16 for the donor element 12 and the display substrate 18. The heating element 16 can provide the same temperature or different temperatures for the donor element 12 and the display substrate 18. These temperatures should be in a range of greater than 30° C. and less than 150° C., and more preferably, greater than 40° C. and less than 130° C. The temperature should not exceed the vaporization temperature of the organic materials. The heating step should be applied prior to transfer of the organic layer 38. It has been found advantageous to apply the heating step both before and during transfer of the organic layer 38. The advantage conferred by the heating element 16 lies in the efficiency and stability of the final display element prepared by the methods described in this invention. While the comprehensive mechanism of this improvement is not presently completely understood at this time, it appears that a higher temperature during the time of laser transfer of the organic layer 38 provides more uniform distribution and better activation of the materials of the transferred organic layer 44. Whatever the details of the mechanism of improvement are, it is observed that displays made by the method of this invention are of higher efficiency and better stability than those made without heating.

The heating element 16 may be a block of metal with embedded electrical resistance heating elements, or means to circulate a heated fluid within the block, or any other convenient way of heating the block. In a useful embodiment, heating element 16 is placed in contact with the display substrate 18. Heating element 16 may be part of the translation stage 32, or attached to it. The heating element 16 may also consist of means for heating by infrared or visible radiation.

While the foregoing description employs a laser for selective deposition of organic materials, it will be appreciated that use of the heating element 16 is not limited to just this embodiment. The use of heating element 16 is advantageous when using any sort of radiation to heat the donor element in order to cause transfer of organic materials through vaporization whether patterned or not. This includes, for example, unpatterned or large area transfer of organic materials using a flash-lamp, an IR heater, resistive heating of a layer of the donor element by passage of an electrical current, or the like. Selective deposition is possible using any localized heating method including, but not limited to, using an optical mask between a flash-lamp and the donor. In all of these cases, the use of heater element 16 provides similar advantages as with laser-induced thermal transfer.

A general description of display substrate 18, organic materials useful for organic EL displays, and other relevant information is provided below.

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with a thin film transistor (TFT). This invention is most advantageous when applied to full color display device fabrication.

Figure 3:
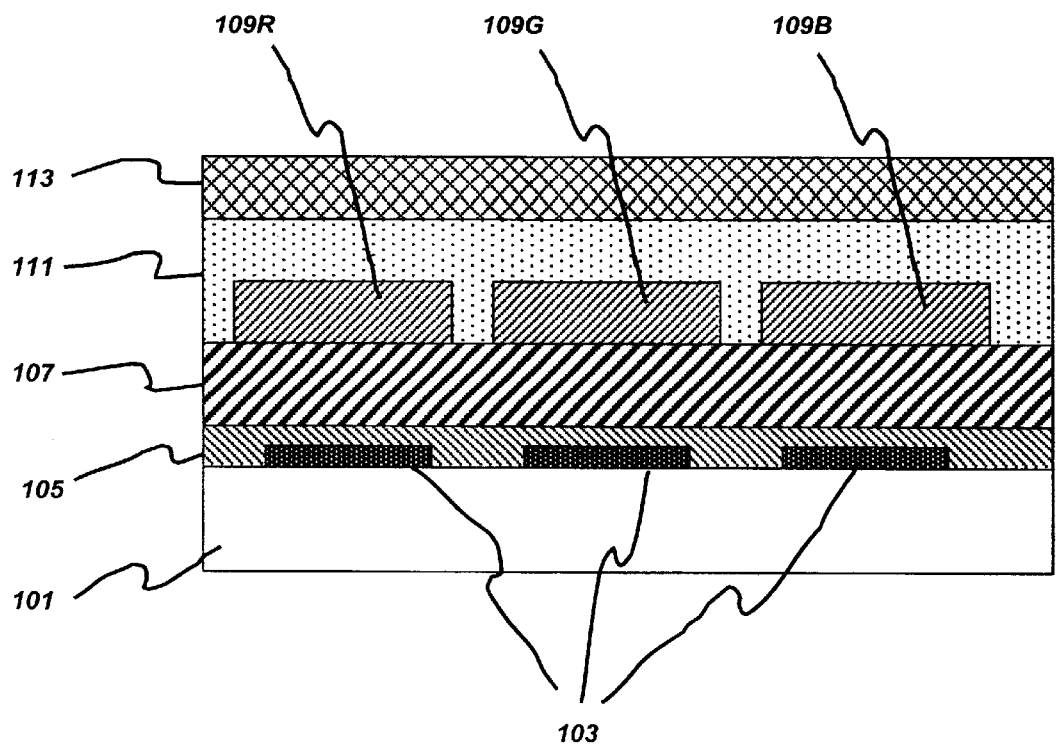
FIG. 3 shows, in cross section, a schematic of a full color organic electroluminescent display device.

There are numerous configurations of the organic layers known in the art wherein the present invention can be successfully practiced. A typical, but not limiting, structure is shown in FIG. 3 and is comprised of a substrate 101, independently addressable anodes 103, an optional hole-injecting layer 105, a hole-transporting layer 107, a light-emitting layer 109 further defined as 109R for red-emitting pixels, 109G for green-emitting pixels, and 109B for blue-emitting pixels, an electron-transporting layer 111, and a cathode layer 113 that may or may not be independently addressable. These layers are described in detail below. Note that the substrate may alternatively be located adjacent to the cathode, or the substrate may actually constitute the anode or cathode. The electrode formed adjacent to the substrate is commonly referred to as the first electrode and the electrode formed after the organic EL materials have been deposited is commonly referred to as the second electrode. The first electrode is commonly formed in a patterned array that defines the RGB pixels. If low operating voltage is desired, the total combined thickness of the organic layers is preferably less than 500 Mn.

The layer transferred by this invention, that is, by radiation-induced thermal transfer, can be any one of the above. Most preferably, at least one of the layers transferred by this invention is a light-emitting layer and is formed over the patterned array of first electrodes in a spatially defined manner to create an array of pixels having a desired color, for example, red. These first electrodes are in electrical connection with the transferred light-emitting layer, either directly or through an intermediate layer such as the hole-transporting layer. Similarly, other light-emitting layers are coated by the method of this invention to form arrays of other colored pixels, for example, green and blue. By coating multiple layers onto donor element 12, multiple layers or materials can be transferred to display substrate 18. Depending on conditions, this transfer can occur with little, partial, or complete mixing of layers. Other layers that do not require precision patterning may be coated by any number of methods described below. In one useful embodiment, the light-emitting layer in each pixel is deposited by laser transfer and the other layers are blanket applied by conventional sublimation.

The substrate 101 can either be light-transmissive or opaque, depending on the intended direction of light emission. The light-transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light-transmissive, light-absorbing or light reflective. Substrates for use in this case include, but are not limited to, glass, plastic, semiconductor materials, ceramics, and circuit board materials. Of course, it is necessary to provide in these device configurations a light-transparent top electrode.

The conductive anode layer 103 is commonly formed over the substrate and, when EL emission is viewed through the anode, should be transparent or substantially transparent to the emission of interest. Common transparent anode materials used in this invention are indium-tin oxide (ITO) and tin oxide, but other metal oxides can work including, but not limited to, aluminum- or indium-doped zinc oxide (IZO), magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. For applications where EL emission is viewed through the top electrode, the transmissive characteristics of layer 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well known photolithographic processes.

While not always necessary, it is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

The hole-transporting layer 107 of the organic EL device contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

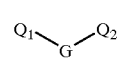

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

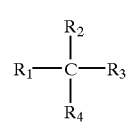

B wherein:

$R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

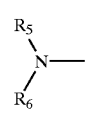

C wherein:

$R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

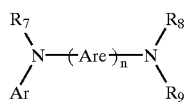

wherein:

each Are is an independently selected arylene group, such as a phenylene or anthracene moiety;

n is an integer of from 1 to 4; and

Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one may employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl (NPB)
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(9-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(2-coronenyl)-N-phenylamino]biphenyl
2,6-Bis(di-p-tolylamino)naphthalene
2,6-Bis[di-(1-naphthyl)amino]naphthalene
2,6-Bis[N-(2-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)-phenyl]amino} biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Different host/dopant combinations are used for different light-emitting pixels.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292; 5,141,671; 5,150,006; 5,151,629; 5,405,709; 5,484,922; 5,593,788; 5,645,948; 5,683,823; 5,755,999; 5,928,802; 5,935,720; 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

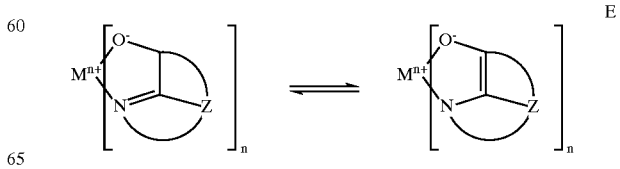

wherein:
M represents a metal;
n is an integer of from 1 to 4; and
Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; an earth metal, such aluminum or gallium, or a transition metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function, the number of ring atoms is usually maintained at 18 or less.

Illustrative of useful chelated oxinoid compounds are the following:
CO-1: Aluminum trisoxine [alias, tris(8-quinolinolato) aluminum(III), alias ALQ]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato) indium]
CO-6: Aluminum tris(5-methyloxine) [alias, tris(5-methyl-8-quinolinolato) aluminum(Ill)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

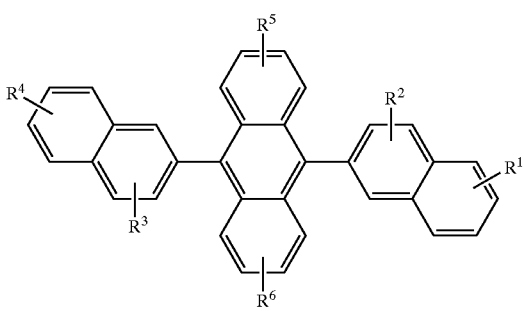

F wherein:
$R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Illustrative examples include 9,10-di-(2-naphthyl) anthracene and 2-t-butyl-9,10-di-(2-naphthyl)anthracene (TBADN). Other anthracene derivatives can be useful as a host in the LEL, including derivatives of 9,10-bis[4-(2,2-diphenylethenyl)phenyl]anthracene.

Benzazole derivatives (Formula G) constitute another class of useful hosts capable of supporting electroluminescence, and are particularly suitable for light emission of wavelengths longer than 400 nm, e.g., blue, green, yellow, orange or red.

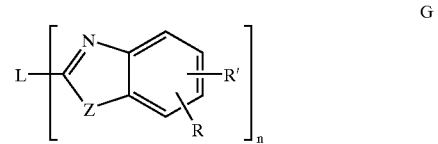

G wherein:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms, for example, phenyl and naphthyl, furyl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

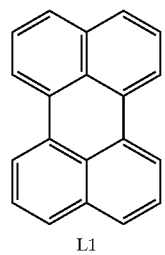
L1
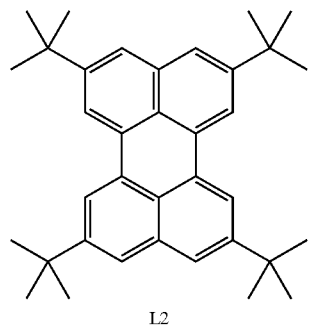
L2
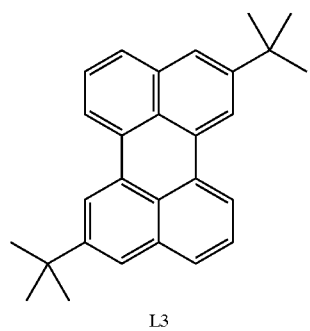
L3
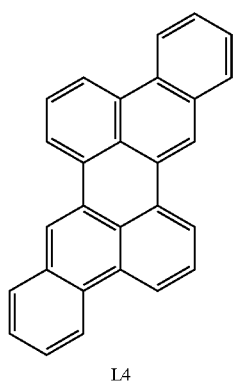
L4
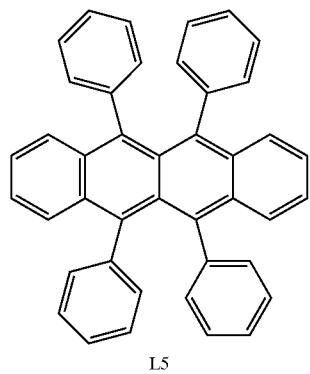
L5
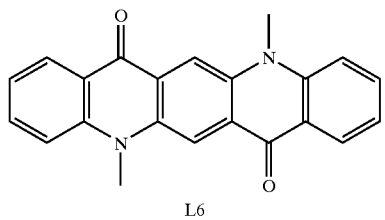
L6
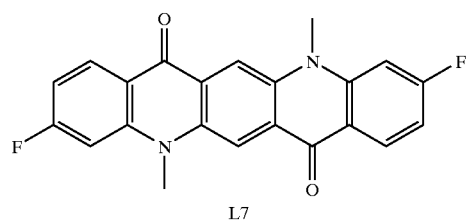
L7
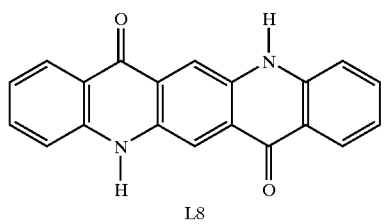
L8

-continued

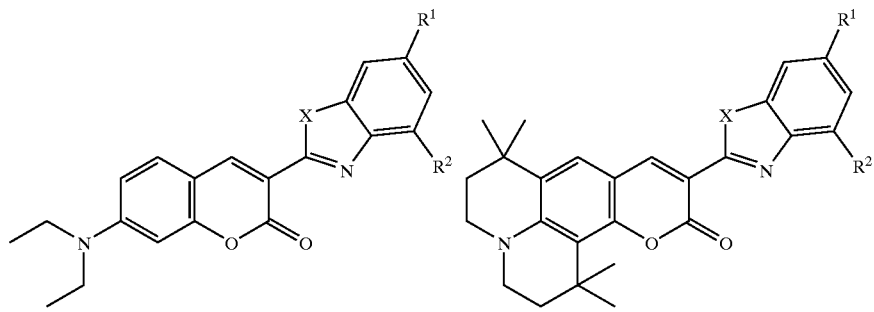

|     | X | R1     | R2     |     | X | R1     | R2     |
|-----|---|--------|--------|-----|---|--------|--------|
| L9  | O | H      | H      | L23 | O | H      | H      |
| L10 | O | H      | Methyl | L24 | O | H      | Methyl |
| L11 | O | Methyl | H      | L25 | O | Methyl | H      |
| L12 | O | Methyl | Methyl | L26 | O | Methyl | Methyl |
| L13 | O | H      | t-butyl| L27 | O | H      | t-butyl|
| L14 | O | t-butyl| H      | L28 | O | t-butyl| H      |
| L15 | O | t-butyl| t-butyl| L29 | O | t-butyl| t-butyl|
| L16 | S | H      | H      | L30 | S | H      | H      |
| L17 | S | H      | Methyl | L31 | S | H      | Methyl |
| L18 | S | Methyl | H      | L32 | S | Methyl | H      |
| L19 | S | Methyl | Methyl | L33 | S | Methyl | Methyl |
| L20 | S | H      | t-butyl| L34 | S | H      | t-butyl|
| L21 | S | t-butyl| H      | L35 | S | t-butyl| H      |
| L22 | S | t-butyl| t-butyl| L36 | S | t-butyl| t-butyl|

|     | R              |     | R       |
|-----|----------------|-----|---------|
| L37 | phenyl         | L41 | phenyl  |
| L38 | methyl         | L42 | methyl  |
| L39 | t-butyl (DCJTB)| L43 | t-butyl |
| L40 | mesityl        | L44 | mesityl |

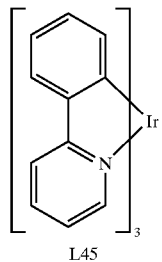

L45

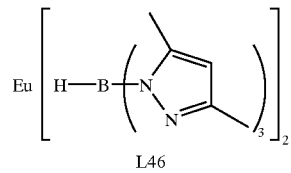

L46

-continued

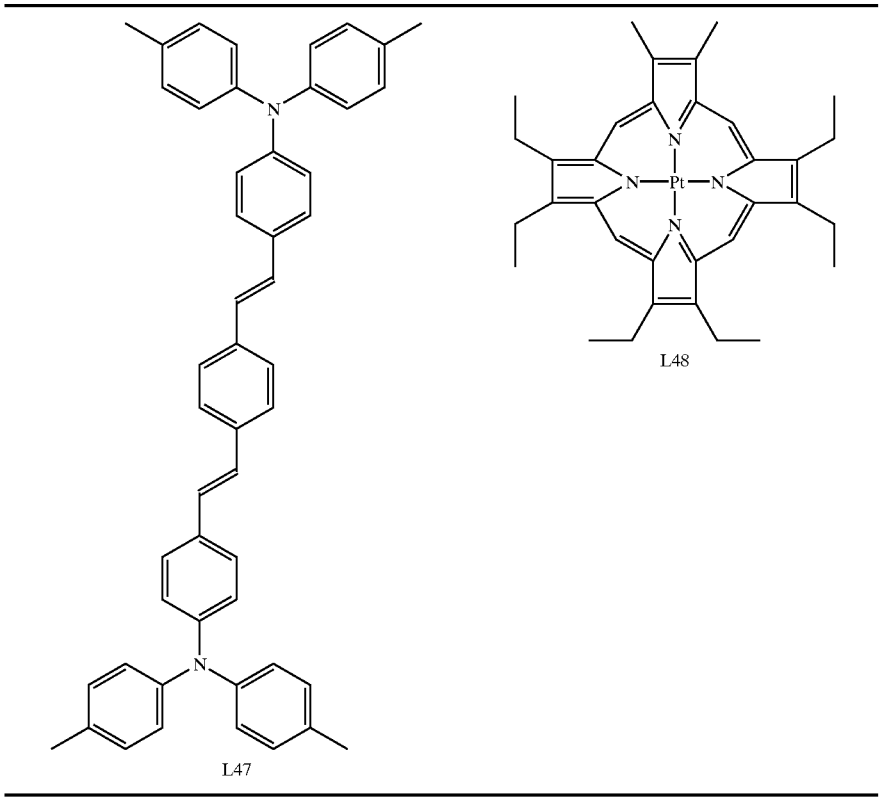

L47

L48

Preferred thin film-forming materials for use in forming the electron-transporting layer 111 of the organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

In some instances, layers 109 and 111 can optionally be collapsed into a single layer that serves the function of supporting both light emission and electron transportation. Similarly, layers 109 and 107 can optionally be collapsed into a single layer that serves the function of supporting both light emission and hole transportation.

When light emission is through the anode, the cathode layer 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Non-patternwise deposition of the organic materials mentioned above, e.g., onto the display substrate 18 or to form organic layer 38 over the donor support, is suitably accomplished through sublimation. However, organic materials may also deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529. Note that layers not requiring patterning may first be deposited onto a support to form donor element 12 and then sublimed in closer proximity to the substrate via unpatterned flash-lamp deposition. Layers requiring a mixture of materials can utilize separate sublimator boats or the materials can be premixed and coated from a single boat or donor sheet.

Most OLED devices are sensitive to moisture and/or oxygen so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890.

The following examples are used to exemplify the present invention.

EXAMPLES

Example 1

A donor element was formed by the vacuum deposition of a radiation-absorbing layer of 60 nm of chromium on a 125 $\mu$m polyimide donor support. Onto this substrate was vacuum deposited a 2.5 nanometer thick layer of CO-1 (ALQ) and 0.2 nm of L39 (DCJTB), 11 nm of TBADN and 0.6 nm of NPB.

A clean glass substrate was vacuum deposited through a mask with indium tin oxide (ITO) to pattern 40 to 80 nm transparent first electrodes (anodes). A plasma oxygen etch followed by plasma deposition of ~0.1 nm of $CF_x$ was used as a hole-injecting layer over the ITO surface. A 75 nm NPB hole-transporting layer was then vacuum deposited. A donor element as previously described was placed on top of the NPB layer and held in proximal contact using vacuum. A small gap was maintained by the by the texture of the donor substrate that had surface roughness features approximately 2 micrometers high. The stage was heated to the temperature indicated in Table 1.

Laser transfer of the light emissive material was effected from the donor element to the display substrate by irradiation of the donor element through the substrate with an infrared laser beam. The beam size was approximately 16 micrometers by 80 micrometers to the $1/e^2$ point scanning along the wide beam direction. The dwell time was 27 microseconds with a power density as listed. Transfer was effected in regions, which were desired to be red colored.

Onto the transferred organic material from the donor element, a 65 nanometers layer of ALQ was vacuum deposited as the electron-transporting layer followed by co-deposition of 20 nanometers of silver and 200 nanometers of magnesium as the second electrode (cathode). Device testing consisted of putting a constant current through the diodes and monitoring the light output. These data are shown in Table 1.

TABLE 1

| Display Substrate Temperature | Laser transfer power | Peak Emission Wavelength | Luminance at 20 mA/cm² | Luminance after 100 hrs at 20 mA/cm² |
|---|---|---|---|---|
| 20° C. (Room Temp - no heating) | 390 mw | 608 | 481 | 305 |
| 60° C. | 390 mw | 612 | 488 | 375 |

Heating to 60° C. generated a red hue (peak emission wavelength) that is preferred to that generated without the heating. Heating to 60° C. also yielded slightly higher initial luminance. Of particular note, the stability was greatly enhanced by heating during the transfer as evidenced by the higher luminance after 100 hours.

Example 2

A donor element was formed by the vacuum deposition of a radiation-absorbing layer of 60 nanometers of chromium on a 125 $\mu$m polyimide donor support. Onto this was vacuum deposited a 18.7 nanometer thick layer of ALQ, 18.7 nanometers of TBADN and 0.2 nanometers of green dopant L7. This donor was used to make a light emitting diode as described in the previous example. Transfer was effected where green emission was desired. Device testing consisted of putting a constant current through the diodes and monitoring the light output. These data are shown in Table 2.

TABLE 2

| Display Substrate Temperature | Transfer power | Peak Emission Wavelength | Luminance at 20 mA/cm² | Luminance after 100 hrs at 20 mA/cm² |
|---|---|---|---|---|
| 37° C. | 460 mw | 524 | 217 | 162 |
| 60° C. | 460 mw | 520 | 215 | 273 |

Heating to 60° C. generated a green hue (peak emission wavelength) that is preferred to that generated at 37° C. The stability was greatly enhanced. In fact, the luminance increased over time for the device heated to 60° C. as evidenced by the higher luminance after 100 hours.

The invention has been described in detail with particular reference to certain preferred embodiments thereof, but it will be understood that variations and modifications can be effected within the spirit and scope of the invention.

PARTS LIST 10 laser printing apparatus
12 donor element
14 laser
16 heating element
18 display substrate
20 lens
22 galvanometer
24 f-theta lens
26 laser beam
28 computer
30 laser power control line
32 translation stage
34 donor support
36 radiation-absorbing layer
38 organic layer
44 transferred organic layer
101 substrate
103 anode
105 hole-injecting layer
107 hole-transporting layer
109 light-emitting layer
109R red light-emitting layer
109G green light-emitting layer
109B blue light-emitting layer
111 electron-transporting layer
113 cathode

What is claimed is:

1. A method for making an organic electroluminescent display device having an array of pixels disposed on a display substrate, comprising the steps of:
    a) providing an array of first electrodes on a display substrate;
    b) providing a donor element comprising a donor support, a radiation-absorbing layer over the donor support, and at least one organic layer over the radiation-absorbing layer, wherein said organic layer comprises the material or materials to be transferred to the display substrate;

c) positioning the donor element in transfer relationship to the display substrate patterned with an array of first electrodes;

d) heating the display substrate or donor element or both within a specified temperature range prior to transfer of the organic layer;

e) focusing and scanning a laser beam of sufficient power and desired spot size on the radiation-absorbing layer of the donor element to effect the transfer of selected portions of the organic layer from the donor element to designated areas corresponding to pixels on the display substrate in electrical connection with the first electrodes; and f) providing a second electrode over the transferred organic portions on the display substrate.

2. The method of claim 1 wherein the heating step includes heating both the donor element and the display substrate to the same temperature.

3. The method of claim 1 wherein the heating step includes heating the donor element and the display substrate to different temperatures.

4. The method of claim 1 wherein the temperature range is greater than 30° C. and less than 150° C.

5. The method of claim 1 wherein the temperature range is greater than 40° C. and less than 130° C.

6. The method of claim 1 wherein the heating step is applied both before and during transfer.

7. The method of claim 1 wherein in the heating step is provided by a heating element in contact with the display substrate.

8. The method of claim 1 further including repeating steps b)–e) to transfer different color producing organic light-emitting layers to provide a full color display device.

9. The method of claim 1 wherein said device also comprises a hole-transporting layer and an electron-transporting layer.

10. The method of claim 9 wherein the hole-transporting layer and electron-transporting layer are deposited by unpatterned vapor deposition.

11. A method for making an organic electroluminescent display device having an array of pixels disposed on a display substrate, comprising the steps of:

a) providing an array of first electrodes on a display substrate;

b) providing a donor element comprising at least one organic layer comprising the material or materials to be transferred to the display substrate;

c) positioning the donor element in transfer relationship to the display substrate patterned with an array of first electrodes;

d) heating the display substrate or donor element or both within a specified temperature range prior to transfer of the organic layer;

e) focusing and scanning a laser beam of sufficient power and desired spot size on the donor element to effect the transfer of selected portions of the organic layer from the donor element to designated areas corresponding to pixels on the display substrate in electrical connection with the first electrodes; and f) providing a second electrode over the transferred organic portions on the display substrate.

12. A method for making an organic electroluminescent display device, comprising the steps of:

a) providing a display substrate having at least one first electrode;

b) providing a donor element comprising at least one organic layer comprising the material or materials to be transferred to the display substrate;

c) positioning the donor element in transfer relationship to the display substrate patterned with an array of first electrodes;

d) heating the display substrate or donor element or both within a specified temperature range prior to transfer of the organic layer;

e) providing radiation of sufficient power and desired area onto the donor element to effect the transfer of selected portions of the organic layer from the donor element to the display substrate in electrical connection with the first electrode or electrodes; and f) providing a second electrode over some or all of the transferred organic portions on the display substrate.

13. The method of claim 12 wherein the donor element also comprises a radiation-absorbing layer between the donor substrate and the organic material to be transferred.

14. The method of claim 13 wherein the temperature range is greater than 40° C. and less than 130° C.

15. The method of claim 13 wherein the heating step is applied both before and during transfer.

16. The method of claim 13 wherein in the heating step is provided by a heating element in contact with the display substrate.

* * * * *